United States Patent [19]

Galvagni

[11] 4,297,773

[45] Nov. 3, 1981

[54] METHOD OF MANUFACTURING A MONOLITHIC CERAMIC CAPACITOR

[75] Inventor: John L. Galvagni, Solana Beach, Calif.

[73] Assignee: AVX Corporation, Great Neck, N.Y.

[21] Appl. No.: 132,083

[22] Filed: Mar. 20, 1980

Related U.S. Application Data

[62] Division of Ser. No. 961,247, Nov. 16, 1978.

[51] Int. Cl.³ .............................................. H01G 4/30
[52] U.S. Cl. .................................. 29/25.42; 264/61; 264/313; 361/306; 361/403
[58] Field of Search ............... 29/25.42; 264/61, 313; 361/321, 306, 403; 174/138 G

[56] References Cited

U.S. PATENT DOCUMENTS 3,166,617  1/1965  Munk .............................. 264/313 X
3,173,974  3/1965  Mohr .............................. 264/313 X
3,520,054  7/1970  Pensack et al. ..................... 264/61 X
3,612,963  10/1971  Piper et al. ..................... 29/25.42 X

FOREIGN PATENT DOCUMENTS 1117437  6/1968  United Kingdom ........... 174/138 G

*Primary Examiner*—Carl E. Hall
*Attorney, Agent, or Firm*—Arthur B. Colvin

[57] ABSTRACT

The present invention is directed to a monolithic capacitor adapted to be secured to a substrate by reflow soldering methods, characterized by the configuration of the capacitor causing the solder to form a compliant mechanical bond between the capacitor terminations and underlying substrate, whereby the likelihood of capacitor failure due to thermal or mechanical shock is greatly reduced. The invention further relates to a method of making a capacitor of the type described.

3 Claims, 6 Drawing Figures

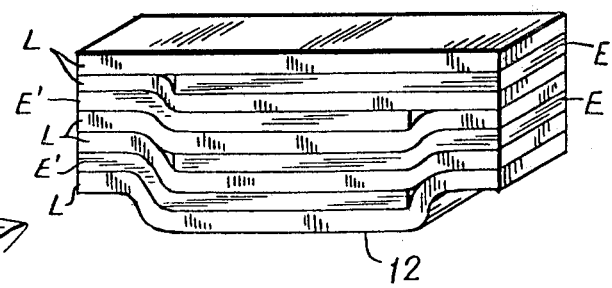
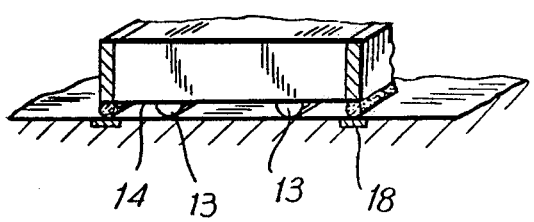
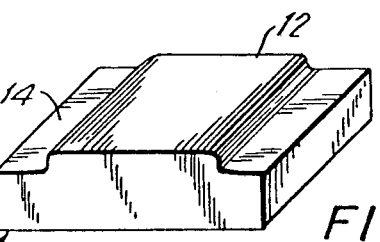
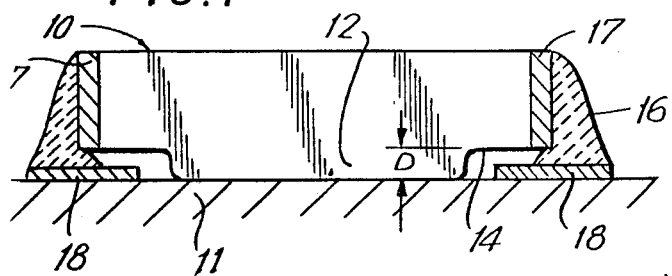
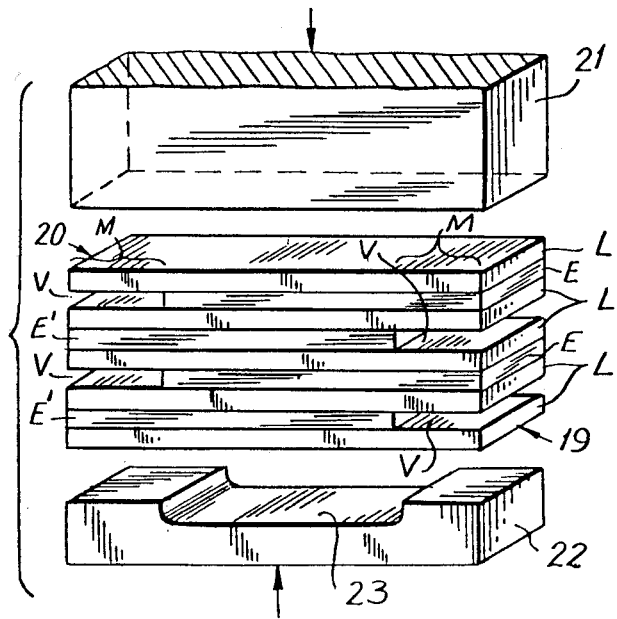

METHOD OF MANUFACTURING A MONOLITHIC CERAMIC CAPACITOR

This is a division of application Ser. No. 961,247, filed Nov. 16, 1978 pending.

BACKGROUND OF THE INVENTION

1. Field of the Invention

The present invention is in the field of monolithic chip capacitors, especially chip capacitors adapted to be connected directly to circuit boards as opposed to capacitors having flexible leads extending therefrom.

2. The Prior Art

Current electronic devices are making progressively increasing use of chip capacitors because of their compactness and inherent reliability.

In accordance with a conventional means for employing such capacitors, the same are provided with two or more termination portions at their end edges and are mounted directly to a substrate of alumina or epoxy-filled fiberglass carrying conductive lands on the surface thereof. Reflow solder connections are effected between the capacitors and the lands, the terminations being in direct contact with the lands. The solder provides both electrical and mechanical connections of the article to the substrate.

In the course of soldering, and in many instances in use, the device incorporating the circuit board and capacitors are subjected to thermal excursions.

Due to the differential coefficients of expansion of the various connected materials and due further to the relative fragility of the capacitors, particularly at the interface between the termination and the capacitor electrodes, a relatively high incidence of capacitor failure has been experienced despite the inherent reliability of the capacitor device. In order to obviate such failure, attempts have been made to introduce a compliant connection at the interface between the capacitor termination and circuit board, such that the differential shrinkage and expansion of the components will not exert undue stresses on the fragile elements of the device but, rather, will be absorbed by flexure of the compliant connector.

While the utilization of such compliant connectors provides a capacitor having an extremely high degree of reliability, the application of the compliance member, such as a tab, or the like has added a significant element of cost increase by virtue of the presence of an additional part, together with the operations necessary to the applying of the part.

An additional loss in reliability of the capacitor is occasioned by the presence of voids in the area between the capacitor electrodes and opposing termination. Such voids have been determined to be present in the capacitor body, in part as a result of the fact that the electrodes between the dielectric layers are of finite thickness. Thus, when a unit of compressive force is applied, utilizing conventional techniques, across the opposed surfaces of the capacitor, greater pressures are developed in the areas of greatest thickness, e.g., the central area in registry with overlapped electrodes of opposite polarity, than in the marginal areas wherein no overlapping of the electrodes occurs. As a result of insufficient compression of the marginal areas, weak spots or voids are present extending from the end of the electrodes terminating short of the end of the capacitor to the termination material at the end of the capacitor, resulting in a capacitor susceptible to voltage breakdown and/or degradation of insulation resistance, with consequent changes in value.

SUMMARY OF THE INVENTION

The present invention may be summarized as directed to an improved monolithic chip capacitor wherein the reflow soldering step utilized to connect the capacitor to the substrate provides a degree of compliance sufficient to render the capacitor highly resistant to damage under the influence of thermal shock, whether such shock is experienced in the application of the capacitor to the substrate or in the subsequent utilization of the device incorporating the capacitor.

More particularly, the invention is directed to an improved capacitor of the type described characterized in that the bottom or substrate-adjacent surface thereof includes an integral depending support portion or portions which, when disposed against the board, lift the lateral termination ends of the capacitor incorporating the terminations a distance of from about 5 to 10 mils or more from the surface of the substrate.

When the termination portions of a capacitor as described are attached as by reflow soldering to the substrate, there is formed a vertical solder bead which, by virtue of the fact that the termination portions are spaced from the conductive lands carried by the substrate, enables the solder bead to act as a compliant column or pillar, permitting compensation for dissimilar thermal elongation characteristics of the capacitor and the substrate to be absorbed by flexure of the column. The compliance of the elongated solder column formed by lifting the termination above the level of the substrate thus prevents fracture, for example, in the connection between the termination portions and the end edges of the electrodes.

The specific means for separating the termination areas of the capacitor from the surface of the land may take various forms. In accordance with a preferred embodiment, a central platform of ceramic may be integrally molded on the bottom surface of the capacitor, which platform is of a height to lift the conductive terminations above the levels of the conductive lands on a substrate or circuit board when the platform abuts the board. The support means preferably is spaced inwardly from the ends of the capacitor to which the termination material is applied, a sufficient distance to assure that the reflow soldering results in the formation of a void in the area between the conductive land and the support means, to avoid compromising the compliant characteristics of the solder bead.

In accordance with a further embodiment of the invention, the support may comprise two or more ridges on the undersurface of the capacitor which function in the same manner as the platform described above.

The invention will be illustratively described in conjunction with a simple capacitor device having two termination portions, with multiple internal electrodes.

In accordance with the preferred embodiment as described above, the support means is formed by compressing the marginal edges of the green ceramic of which the capacitor is formed, prior to firing, to a greater degree than the central portion thereof, whereby there is defined below the bottom surface of the capacitor a depending platform or ledge, the noted practice having the additional advantage of compressing the marginal areas between electrodes and termination to exclude the possibility of weak spots or voids in such areas.

Accordingly, it is an object of the invention to provide an improved monolithic chip capacitor whereby a reflow solder-formed connection between the capacitor and a substrate will inherently possess a degree of compliance sufficient to preclude damage to the capacitor or to the connection between the capacitor and substrate, due to differential thermal coefficients of expansion of the capacitor and the substrate.

A further object of the invention is the provision of an improved capacitor wherein the solder connection formed between the capacitor and substrate possesses a high degree of compliance.

Still a further object of the invention is the provision of a capacitor of the type described having a cost of production not materially different from conventional capacitors of the same type.

Still a further object of the invention is the provision of capacitors of the type described having increased resistance to the formation of weak spots or voids in the margin areas adjacent the capacitor terminations.

Still a further object of the invention is the provision of methods of manufacturing a capacitor of the type described.

To attain these objects and such further objects as may appear herein or be hereinafter pointed out, reference is made to the accompanying drawings, forming a part hereof, in which:

FIG. 1 is a diagrammatic side elevational view of a capacitor in accordance with the invention applied to a substrate;

FIG. 2 is a perspective view of the under surface of the capacitor of FIG. 1;

FIG. 3 is a diagrammatic isometric view of a forming die for fabrication of a capacitor in accordance with the invention;

FIG. 4 is a diagrammatic isometric view of the partially formed capacitor;

FIG. 5 is a perspective view of a capacitor in accordance with a further embodiment of the invention.

Figure 6:
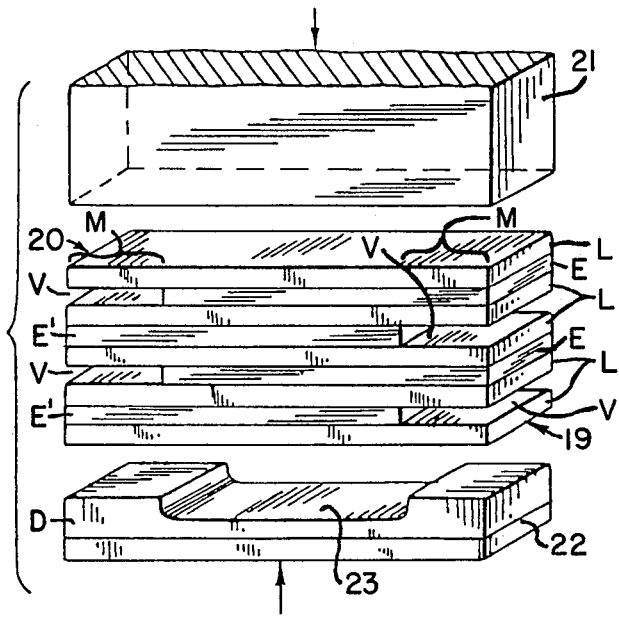
FIG. 6 is a perspective view of a capacitor in accordance with a further embodiment of the invention using an elastomeric die member.

Turning now to the drawings, there is shown in FIG. 1 a monolithic chip capacitor 10 secured to an insulating substrate 11. Typically, the substrate may comprise alumina or epoxy filled glass fiber, both of which materials have coefficients of thermal expansion differing from the thermal coefficient of expansion of the capacitor. It should be recognized that the capacitor itself is comprised of a plurality of layers of ceramic materials which are subject to fracture or separation should the capacitor be exposed to undue compressive or expansive stresses. Such stresses are present if, as is typical, the conductive capacitor termination formed at the marginal ends of the capacitor is secured directly against the conductive land formed on the substrate, locking the capacitor against substantial movement relative to the substrate.

It will be appreciated that upon cooling of the components after a solder bead has been formed, compressive or expansive forces are inevitably developed, resulting from the differential thermal expansion factors.

In accordance with the present invention, the effects of such stresses and, to a degree, mechanical shocks are mitigated so as to avoid compromise of the capacitor or its connection to the substrate by the provision of support means, e.g. the platform 12 disclosed in the preferred embodiment of FIGS. 1 to 4, or the ridges 13 as disclosed in the embodiment of FIG. 5, which space the under surface 14 of the bottom of the capacitor a distance D from the substrate 11 of from about 5 to 10 or more mils from the upper surface 15 of the substrate, to ensure that a substantial expanse or vertical column 16 of solder will exist between the termination portions 17, 17 of the capacitor and the substrate.

By the expedient of providing integral support means on the ceramic body which, while unconnected to the substrate lift the termination portions the aforesaid distance above the substrate, there is assured the provision of a solder connection of sufficient length to provide a relatively high compliance connection between the capacitor and the conductive lands 18 of the substrate such as to cause mechanically generated stresses to be absorbed or compensated within the solder body rather than being transmitted to the capacitor at sufficiently high levels to cause capacitor failure or change in value.

It will be observed that the compliance effect compensates both for relative extension and contraction of the substrate and capacitor.

Referring now to FIG. 3, there is diagrammatically disclosed a method of forming the capacitor of FIGS. 1 and 2. As is conventional, the capacitor is comprised of a series of ceramic layers L defining the dielectric components of the capacitor and the encapsulation thereof. Between the layers L there are formed the electrodes E, E', which electrodes, although formed as by screening of metal onto an associated ceramic layer, are of finite thickness. The electrodes of one polarity, e.g. the electrodes E, run from marginal end 19 longitudinally, terminating at a position short of the opposite marginal end 20 of the capacitor. In similar fashion, the electrodes E' of opposite polarity begin at a position coextensive with the marginal end 20 and terminate short of the opposite marginal end 19.

As will be readily recognized from the above described essentially conventional construction, by virtue of the finite, albeit small, thickness of the electrodes E, E', a series of voids V may exist in the areas between the marginal end 20 and the electrodes E, and between the marginal end 19 and the electrodes E'. In order to provide both the support-spacer means 12 shown in the capacitor of FIGS. 1 and 2, and also to eliminate the voids which constitute areas of incipient capacitor failure, there is provided a die member or die construction which compresses the marginal portions M (being the portions where there is no overlap of electrodes of opposite polarity) a greater degree than the central area wherein the opposite polarity electrodes overlap.

The die member, which has been diagrammatically illustrated may include a flat top plate 21 and a base plate 22 recessed as at 23 in the area in registry with the overlapping portions of opposite polarity electrodes. When the die member is closed, the green ceramic in the marginal portions as above defined will be compressed to a greater extent than, or at least to an extent equal to, the compression applied to the central area resulting in a concomitant compression and consequent elimination of voids in registry with the marginal portions.

The device at the same time forms the desired platform 12 which, as noted above, will function to space the subsequently formed end termination portions 17 a distance above the level of the substrate when the capacitor is soldered to a circuit board or the like. The method of forming the capacitor is thus functionally distinguished from conventional manufacturing processes wherein the entirety of the surfaces are compressed between flat platens, resulting in greater pressures in the area in registry with the overlapping electrodes than in the thinner marginal areas.

There is illustrated in FIG. 4 a capacitor subassembly as removed from the die members 21, 22, illustrating the effects of additional compression in the margin areas and consequent elimination of the voids.

As will be understood by those skilled in the art, the ceramic member illustrated in FIG. 4 will be fired, following which termination portions 17 will be applied, providing means for connecting electrodes of opposite polarity into the circuit.

In accordance with a variation of the manufacturing procedure, shown in FIG. 6, the die portion 22 employed as the means of forming the under surface of the capacitor may incorporate a yieldable elastomeric layer D on the surface engaging the green ceramic. Of course, the yieldable elastomeric layer D should yield to allow a central recess at 23, to form a capacitor as shown in FIG. 4. The resilience of the elastomeric layer will automatically effect the desired additional compression of the marginal portions, the total thickness of which marginal portions, by virtue of the absence of overlapping electrodes of opposite polarity, will, after compression, be less than the thickness of the central area whereat the electrodes overlap.

It will be understood that the die 22 may utilize one or both of the expedients of recess and the resilient layer.

It is further possible, where the composite additional thickness of the overlapping electrodes is sufficiently great, to rely upon such additional thickness in combination with an elastomeric die member to achieve the desired platform portion.

As will be evident to those skilled in the art in the light of the instant disclosure, numerous variations may be made in the concepts hereinabove set forth without departing from the spirit of the invention. For instance, the configuration and number of ridges, steps or like support means employed on the under surface of the capacitor are not critical so long as the same satisfy the function of lifting the marginal terminal edges of the capacitor to assure the existence of a substantial span of solder between the termination ond the substrate. The support means are preferably spaced inwardly a distance from the marginal edges to assure that the solder does not flow into the entire space between the land and the support portion, in which case there would be increased possibility of transmitting greater stresses to the capacitor.

Accordingly, the invention is to be broadly construed within the scope of the appended claims.

Having thus described the invention and illustrated its use, what is claimed as new and is desired to be secured by Letters Patent is:

1. A method of manufacturing a monolithic ceramic capacitor device which includes a central area having internal partially overlapping electrodes of opposite polarity contained in a ceramic body forming a dielectric separator for said electrodes, said electrodes including outer end portions disposed at opposite ends of said body in contact with termination portions, said capacitor including a margin portion between said central area and each of said termination portions, said capacitor including a bottom surface for positioning adjacent a substrate, comprising the steps of:

aligning the outer end portions of first ones of said electrodes to define a first coextensive end at one end of the ceramic body, each of said first electrodes terminating short of the other end of the ceramic body;

aligning the outer end portions of second ones of said electrodes to define a second coextensive end at the opposte end of the ceramic body, said second electrodes interposing between said first electrodes, each of said second electrodes terminating short of the first coextensive end at the one end of the ceramic body;

interposing layers of ceramic between each of said first and second electrodes, thereby defining a series of aligned spaces inward of each of the opposed coextensive ends in the respective margin portions, the arrangement of said electrodes and ceramic layers forming a capacitor sub-assembly;

applying to said sub-assembly compressive forces exerted in a direction normal to the orientation of said electrodes to deform selective ones of said electrodes and ceramic layers into said spaces and to form indentations in said bottom surface, said indentations being in registry with the margin portions and extending to said ends, whereby a portion of said bottom surface between said indentations is at a level below the level of said indentations; and completing the cure of said ceramic body, and applying conductive coating at the opposed ends to form said termination portions.

2. The method in accordance with claim 1 including the step of applying said compressive forces against said bottom surface through the medium of a die member having raised portions in registry with said margin portions of said ceramic capacitor device.

3. The method in accordance with claim 1 including the step of interposing a depthwisely compressible member against said bottom surface of said green ceramic prior to applying said compressive forces.

* * * * *